United States Patent
Teng (10) Patent No.: US 8,146,495 B2
(45) Date of Patent: *Apr. 3, 2012

(54) DEACTIVATING DEVICE AND METHOD FOR LITHOGRAPHIC PLATE

(76) Inventor: Gary Ganghui Teng, Northborough, MA (US)

( * ) Notice: Subject to any disclaimer, the term of this patent is extended or adjusted under 35 U.S.C. 154(b) by 265 days.

This patent is subject to a terminal disclaimer.

(21) Appl. No.: 12/534,153

(22) Filed: Aug. 2, 2009

(65) Prior Publication Data

US 2009/0290140 A1 Nov. 26, 2009

Related U.S. Application Data (62) Division of application No. 11/728,648, filed on Mar. 26, 2007, now Pat. No. 7,874,249.

(51) Int. Cl.
*B41M 5/00* (2006.01)
*B41N 3/00* (2006.01)

(52) U.S. Cl. .................. 101/463.1; 101/401.1

(58) Field of Classification Search ............. 101/463.1
See application file for complete search history.

(56) References Cited

U.S. PATENT DOCUMENTS

| | | | | |
|---|---|---|---|---|
| 5,607,816 A | 3/1997 | Fitzgerald et al. | ......... | 430/271.1 |
| 5,809,881 A * | 9/1998 | Deschner et al. | ............. | 101/132 |
| 5,910,395 A | 6/1999 | Li et al. | .......................... | 430/302 |
| 6,014,929 A | 1/2000 | Teng | ............................. | 101/456 |
| 6,136,503 A | 10/2000 | Zheng et al. | ................ | 430/270.1 |
| 6,153,356 A | 11/2000 | Urano et al. | ................ | 430/281.1 |
| 6,232,038 B1 | 5/2001 | Takasaki et al. | ........... | 430/281.1 |
| 6,309,792 B1 | 10/2001 | Hauck et al. | ................ | 430/270.1 |
| 6,331,375 B1 | 12/2001 | Kawamura et al. | ........ | 430/270.1 |
| 6,482,571 B1 | 11/2002 | Teng | ............................. | 430/302 |
| 6,576,401 B2 | 6/2003 | Teng | ............................. | 430/303 |
| 6,689,537 B2 | 2/2004 | Urano et al. | ................ | 430/273.1 |
| 6,740,464 B2 | 5/2004 | Maemoto | ...................... | 430/138 |
| 6,881,532 B2 * | 4/2005 | Suzuki | ......................... | 430/302 |
| 7,874,249 B2 * | 1/2011 | Teng | ......................... | 101/463.1 |
| 2003/0186165 A1 | 10/2003 | Gries et al. | ................. | 430/281.1 |
| 2004/0013968 A1* | 1/2004 | Teng | .......................... | 430/270.1 |
| 2005/0196164 A1* | 9/2005 | Sasayama | ..................... | 396/571 |

* cited by examiner

*Primary Examiner* — Judy Nguyen
*Assistant Examiner* — Shema Freeman (57) ABSTRACT

A device as well as method for deactivating without developing an exposed lithographic printing plate is disclosed. The device comprises a structure for providing a deactivating agent that is capable of deactivating without developing the plate. The plate comprises on a substrate a photosensitive layer capable of hardening upon exposure to a radiation, and becoming incapable of or having reduced rate of hardening after contacting with a deactivating agent. The deactivated plate is safe or has better stability at room lighting, and can be handled under room lighting before and during development. The development can be on press with ink and/or fountain solution or off press with a liquid developer.

16 Claims, 3 Drawing Sheets

DEACTIVATING DEVICE AND METHOD FOR LITHOGRAPHIC PLATE

RELATED PATENT APPLICATIONS

This application is a divisional of Ser. No. 11/728,648 filed Mar. 26, 2007 now U.S. Pat. No. 7,874,249.

FIELD OF THE INVENTION

This invention relates to lithographic printing. More particularly, it relates to a device and method for deactivating a photosensitive lithographic printing plate after imagewise exposure and before development.

BACKGROUND OF THE INVENTION

Lithographic printing plates (after process) generally consist of ink-receptive areas (image areas) and ink-repelling areas (non-image areas). During printing operation, an ink is preferentially received in the image areas, not in the non-image areas, and then transferred to the surface of a material upon which the image is to be produced. Commonly the ink is transferred to an intermediate material called printing blanket, which in turn transfers the ink to the surface of the material upon which the image is to be produced.

At the present time, lithographic printing plates (processed) are generally prepared from lithographic printing plate precursors (also commonly called lithographic printing plates) comprising a substrate and a photosensitive coating deposited on the substrate, the substrate and the photosensitive coating having opposite surface properties. The photosensitive coating is usually a photosensitive material, which solubilizes or hardens upon exposure to an actinic radiation, optionally with further post-exposure overall treatment. In positive-working systems, the exposed areas become more soluble and can be developed to reveal the underneath substrate. In negative-working systems, the exposed areas become hardened and the non-exposed areas can be developed to reveal the underneath substrate. The exposed plate is usually developed with a liquid developer to bare the substrate in the non-hardened or solubilized areas.

On-press developable lithographic printing plates have been disclosed in the literature. Such plates can be directly mounted on press after exposure to develop with ink and/or fountain solution during the initial prints and then to print out regular printed sheets. No separate development process before mounting on press is needed. Among the patents describing on-press developable lithographic printing plates are U.S. Pat. Nos. 5,258,263, 5,516,620, 5,561,029, 5,616,449, 5,677,110, 5,811,220, 6,014,929, 6,071,675, and 6,482,571.

Conventionally, the plate is exposed with an actinic light (usually an ultraviolet tight from a lamp) through a separate photomask film having predetermined image pattern that is placed between the light source and the plate. While capable of providing plate with superior lithographic quality, such a method is cumbersome and labor intensive.

Laser sources have been increasingly used to imagewise expose a printing plate which is sensitized to a corresponding laser wavelength. This allows the elimination of the photomask film, reducing material, equipment and labor cost. Suitable lasers include infrared lasers (such as laser diode of about 830 nm and NdYAG laser of about 1064 nm), visible lasers (such as frequency-doubled NdYAG laser of about 532 nm, violet laser diode of about 390 to 430 nm), and ultraviolet laser (such as ultraviolet laser diode of about 350 to 370 mm).

Among them, infrared laser diode, violet laser diode, and ultraviolet laser diode are most attractive. Infrared laser sensitive plates have the advantage of relative white or yellow light stability, violet laser sensitive plates have the advantage of low imager cost due to the low cost of the violet laser diode which is made in mass production for DVD, and ultraviolet laser diode sensitive plates have the advantage of higher sensitivity (requiring less laser dosage) than longer wavelength lasers.

Laser sensitive plates generally have higher sensitivity (than conventional film based plate) because of the limited laser power and the desire for fast imaging speed. Accordingly, photosensitive plates designed for laser imaging generally have limited room light stability. For example, before being developed to remove the non-hardened areas, frequency-doubled NdYAG laser sensitive plates usually require red room light for handling, violet laser sensitive plates usually require orange or yellow room light for handling, and infrared laser sensitive photopolymer plates usually require yellow room light for handling and have only limited white light stability (due to, for example, the use of certain initiator which has spectral sensitivity in the ultraviolet region).

The limited room light stability of such laser sensitive plates (as well as some conventional radiation sensitive plates) causes major inconvenience in the use of such plates, because they either require safe light or light-tight covers during handling before and during development, or have limited (white or even yellow or red) room light handling window before development. Particularly, such limited room light stability is an inherent barrier for the design and use of on-press developable laser sensitive lithographic plate because the pressrooms are generally equipped with white light.

It would be desirable if a device or method can be developed which allows the exposed plate to be deactivated so that it can be handled under white light before development.

SUMMARY OF THE INVENTION it is an object of this invention to provide a device as well as a method for deactivating the photo hardening (negative-working) or photo solubilization (positive-working) capability of a lithographic printing plate in the non-exposed areas without developing the plate after imagewise laser exposure and before development. This allows the imagewise exposed (imaged) plate to be handled and developed under white light or other light that is unsafe to the plate if not deactivated.

Further objects, features and advantages of the present invention will become apparent from the detailed description of the preferred embodiments.

According to the present invention, there has been provided a lithographic printing plate deactivating device comprising:

(a) a structure for providing a deactivating agent; and
(b) a means for transporting an imagewise exposed lithographic plate through said structure to contact with said deactivating agent to deactivate without developing said plate;
(c) wherein said exposed plate comprises on a substrate a photosensitive layer having exposed (hardened or solubilized) areas and non-exposed (non-hardened or non-solubilized) areas, the non-exposed areas being capable of hardening (for negative plate) or solubilization (for positive plate) under a room light (preferably a white light) before contacting with said deactivating solution, and becoming incapable of or having reduced rate of hardening or solubilization (preferably incapable of hardening or solubilization) under said room light after contacting with said deactivating solution.

The plate can be a negative plate (with the photosensitive layer capable of hardening upon imagewise exposure to a radiation as well as under a room light for a certain time) or a positive plate (with the photosensitive layer capable of solubilization upon imagewise exposure to a radiation as well as under a room light for a certain time). Preferably, the plate is a negative plate, with the photosensitive layer capable of hardening upon imagewise exposure with a radiation as well as under white room light. The photosensitive layer in the non-hardened or solubilized areas is preferably developable with a liquid developer or with ink and/or fountain solution, more preferably with an aqueous alkaline developer or with ink and/or fountain solution, and most preferably with ink and/or fountain solution. Before being deactivated, the plate can be imagewise exposed with any radiation which is actinic to the photosensitive layer, preferably with a laser having a wavelength selected from 200 to 1200 nm, more preferably a violet or ultraviolet laser (200 to 430 nm) or an infrared laser (750 to 1200 nm), most preferably a violet or ultraviolet laser.

The deactivating agent can be any material (preferably in the form of solution) that is capable of deactivating the photo hardening capability (for negative plate) or photo solubilization capability (for positive plate) of the photosensitive layer. The structure can be any design that can apply the deactivating agent to the plate; preferably it is a tank containing the deactivating agent, a set of spray nozzles which spray out the deactivating agent, or one or more rollers which apply the deactivating agent to the plate.

The deactivating device can further comprise a heating unit for heating said plate before passing through said structure for deactivation. The deactivating device can also comprise a water rinse unit for rinsing said plate before passing the plate through said structure for deactivation; this water rinse is especially useful for plate having a water soluble or dispersible overcoat. A pair of squeegee rollers can be installed after the deactivating structure to squeeze off any excess amount of deactivating agent from the plate after coming out of the deactivating structure. The device can further comprise a drying unit for drying off the water and/or any solvent from the deactivated plate after passing through the structure.

The deactivating device can be standalone wherein the exposed plate is hand-fed to the deactivating device, or the deactivating device can be connected to an imager. Preferably, the deactivating device is connected to an imager for imagewise exposing a lithographic plate before transporting the exposed plate to said deactivating device. The combination of an imager and a deactivating device is also called a lithographic plate imaging and deactivation assembly in this application. The assembly is preferably connected to a cassette containing at least one plate and capable of automatically feeding said plate from said cassette to said imager for imagewise exposure.

According to another aspect of the present invention, there has been provided a method of processing a lithographic printing plate comprising in order:

(a) providing a lithographic printing plate comprising on a substrate a photosensitive layer capable of hardening (for positive plate) or solubilization (for negative plate) upon exposure to a radiation (preferably a laser) having a wavelength selected from 200 to 1200 nm;

(b) imagewise exposing said plate with said radiation to cause hardening or solubilization of the photosensitive layer in the exposed areas;

(c) overall applying a deactivating agent to said exposed plate to deactivate the photo hardening or photo solubilization capability of said photosensitive layer without developing said plate; and (d) developing said deactivated plate with ink and/or fountain solution on a lithographic press, or with a liquid developer on a developing processor (preferably not connected to a deactivating device), to remove the non-hardened or solubilized areas of said photosensitive layer.

The plate can be a negative plate or a positive plate, preferably a negative plate. Said radiation can be a conventional light (such as UV light from a lamp) or a laser, preferably a laser having a wavelength selected from 200 to 1200 nm, more preferably a violet or ultraviolet laser (200 to 430 nm) or an infrared laser (750 to 1200 nm), most preferably a violet or ultraviolet laser. The plate can be developed with a liquid developer or with ink and/or fountain solution, preferably with an aqueous alkaline developer or with ink and/or fountain solution, and most preferably with ink and/or fountain solution on a lithographic press. The imagewise exposed plate is preferably deactivated on a deactivating device by passing said plate through said device. The deactivating device is preferably connected to an imager for said imagewise exposure, and the exposed plate is preferably automatically transferred from said imager to the deactivating device. Preferably, both said device and said imager are shielded with covers so that no or substantial no room light reaches the plate during the imaging, the transportation from the imager to the deactivating device, and the deactivation. The imager is preferably connected to a cassette containing at least one plate and capable of automatically feeding said plate from said cassette to said imager for imagewise exposure.

The imaging and deactivation steps can be performed with the plate under any lightings (including darkness) which will not cause hardening or solubilization of the photosensitive layer in the non-exposed areas at least within the limited time required for the steps (with the same or different lightings for the steps), and the development step can be performed with the plate under any lighting. Preferably, the imaging and deactivation steps are each performed with the plate under a yellow or red light (such as with the plate open to a yellow or red room light or shielded with yellow or red light-passing-only covers) or in darkness or substantial darkness (such as with the plate shielded with light-tight or substantially light-tight covers), and the development step is performed with the plate under white light.

DETAILED DESCRIPTION OF THE PREFERRED EMBODIMENTS

The lithographic printing plate deactivating device of the invention comprises a structure for providing a deactivating agent, a transfer means for passing a lithographic printing plate to be in contact with said deactivating agent, and an imagewise exposed lithographic printing plate that is transferred by said transfer means; wherein said exposed plate comprises on a substrate a photosensitive layer having exposed (hardened or solubilized) areas and non-exposed (non-hardened or non-solubilized) areas, the non-exposed areas being capable of hardening (for negative plate) or solubilization (for positive plate) under a room light (preferably a white room light) before contacting with said deactivating solution, and becoming incapable of or having reduced rate of hardening or solubilization (preferably incapable of hardening or solubilization) under said room light after contacting with said deactivating solution. The deactivating agent can be any material that is capable of deactivating the photo hardening capability (for negative plate) or photo solubilization capability (for positive plate) of the photosensitive layer.

The structure can be any design which provides the deactivating agent to the plate. It can be a tank containing the deactivating agent, a set of spray nozzles which spray out the deactivating agent, or a roller or rollers which apply the deactivating agent to the plate.

The device is preferably shielded with covers so that no or substantially no room light reaches the plate when passing through the deactivating device at least before being deactivated. The deactivating device can further comprise a heating unit for heating said plate before passing through said structure for deactivation. It can also comprise a water rinse unit before passing the plate through said structure. A pair of squeegee rollers can be installed after the deactivating structure to squeeze any excess amount of deactivating agent off the plate after coming out of the deactivating structure. The device can further comprise a drying unit (such as a unit supplying forced hot air) for drying off water and/or any solvent from the deactivated plate after passing through the structure.

The device is preferably connected to an imager for imagewise exposing a lithographic plate before transporting the exposed plate to said deactivating device. The combination of an imager and a deactivating device is also called a lithographic plate imaging and deactivation assembly in this application. Preferably, said device and/or said imager are shielded with (non-transparent or yellow or red light-passing-only) covers so that no or substantially no room light or the unsafe portion of the room light reaches the plate when being handled and exposed on said imager, when transporting from said imager to said deactivating device, and/or when passing through the deactivating device before being deactivated. More preferably, both said device and said imager, or the whole assembly, are shielded with covers so that no or substantially no room light reaches the plate when being handled and exposed on said imager, when transporting from said imager to said deactivating device, and when passing through the deactivating device before being deactivated. The assembly is preferably connected to a cassette (which is preferably light-tight) containing at least one plate and capable of automatically feeding said plate from said cassette to said imager for imagewise exposure.

Figure 1:
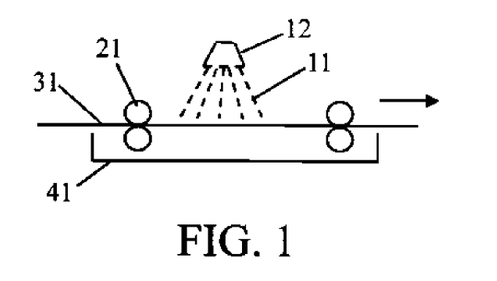
FIG. 1 is a diagrammatic cross-sectional view of a lithographic printing plate deactivating device of the invention comprising a spray unit for supplying a deactivating agent to an imagewise exposed lithographic printing plate to deactivate without developing the plate.

FIG. 1 is a diagrammatic cross-sectional view of a lithographic printing plate deactivating device of the invention comprising a spray unit 12 for supplying a deactivating agent 11 to an imagewise exposed lithographic printing plate 31 to deactivate without developing the plate. Said device further comprises a transfer means 21 for transporting said plate through said deactivating structure to contact said deactivating agent with at least the coated said of the plate. A collecting tray 41 is provided to collect any overflowing deactivating agent. Optionally, the used deactivating agent in the tray can be recirculated to the spray unit for reuse; a pipe as well as a pump (not shown) can be connected from the tray to the spray unit.

Figure 2:
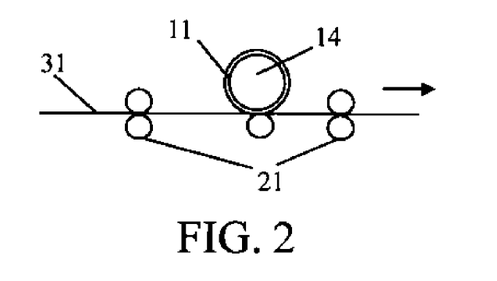
FIG. 2 is a diagrammatic cross-sectional view of a lithographic printing plate deactivating device of the invention comprising a roller for supplying a deactivating agent to an imagewise exposed lithographic printing plate to deactivate without developing the plate.

FIG. 2 is a diagrammatic cross-sectional view of a lithographic printing plate deactivating device of the invention comprising at least one roller 14 for supplying a deactivating agent 11 to an imagewise exposed lithographic printing plate 31 to deactivate without developing the plate. The plate is transported by a transfer means 21.

Figure 3:
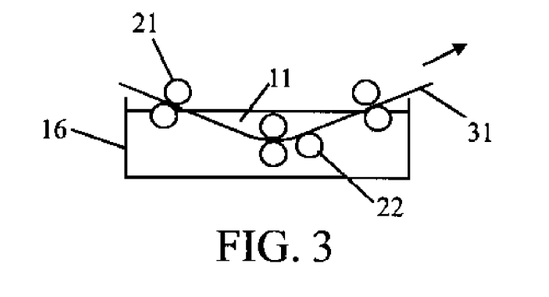
FIG. 3 is a diagrammatic cross-sectional view of a lithographic printing plate deactivating device of the invention comprising a tank (reservoir) containing a deactivating agent and a transporting means for passing an imagewise exposed lithographic printing plate through the deactivating agent in the tank to deactivate without developing the plate.

FIG. 3 is a diagrammatic cross-sectional view of a lithographic printing plate deactivating device of the invention comprising a tank (reservoir) 16 containing a deactivating agent 11 and a transporting means 21 for passing an imagewise exposed lithographic printing plate 31 through the deactivating agent in the tank to deactivate without developing the plate.

Figure 4:
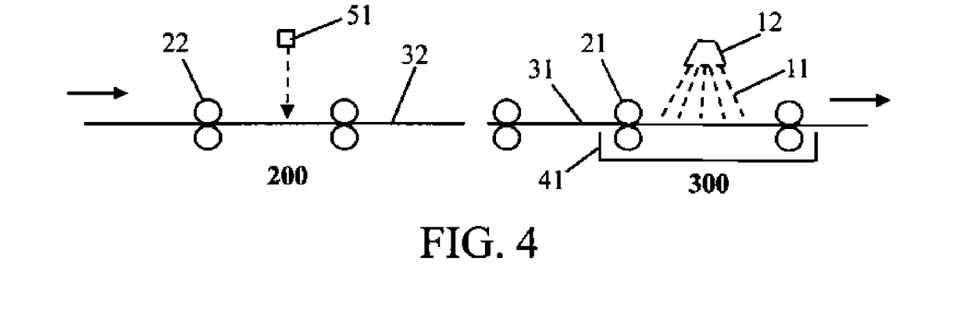
FIG. 4 is a diagrammatic cross-sectional view of a lithographic printing plate exposure and deactivation assembly of the invention comprising a flatbed laser imager (exposure device) and a deactivating device; wherein a lithographic printing plate is exposed with the imager and then deactivated with the deactivating device.

FIG. 4 is a diagrammatic cross-sectional view of a lithographic printing plate exposure and deactivation assembly of the invention comprising a flatbed laser imager (exposure device) 200 having a laser 51 and a deactivating device 300 having a spray unit 12 for spraying out a deactivating agent 11; wherein a lithographic printing plate 31 is exposed with the imager and then transferred by the transfer means 21-22 to the deactivating device for deactivation.

Figure 5:
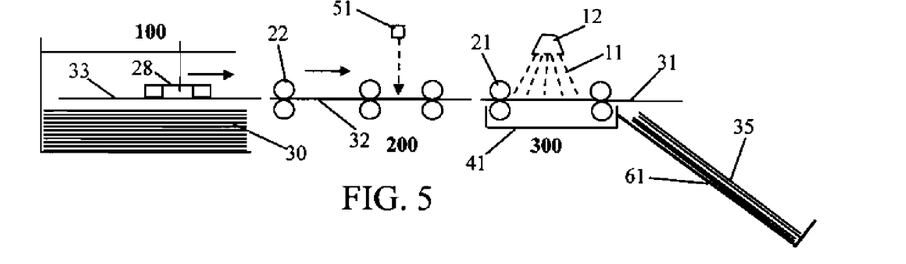
FIG. 5 is a diagrammatic cross-sectional view of a lithographic printing plate exposure and deactivation assembly of the invention comprising a flatbed laser imager and a deactivating device, as well as a plate cassette for automatically feeding the plate for imaging and a collecting tray for the deactivated plates; wherein a lithographic printing plate is fed from a plate cassette to the imager for laser exposure, then deactivated with the deactivating device, and further transferred to the collecting tray.

FIG. 5 is a diagrammatic cross-sectional view of a lithographic printing plate exposure and deactivation assembly of the invention comprising a flatbed laser imager 200 having a laser 51 and a deactivating device 300 having a spray unit 12 for spraying out a deactivating agent 11, as well as a plate cassette 100 having one or more plates 30 for automatically feeding the plate 33 for imaging and a collector 61 for collecting the deactivated plates 35; wherein a lithographic printing plate 33 is picked up by the feeder 28 from a plate cassette to feed to the imager for laser exposure, then transported by the transfer means 21-22 to the deactivating device for deactivation, and further transported to the collecting tray 61.

Figure 6:
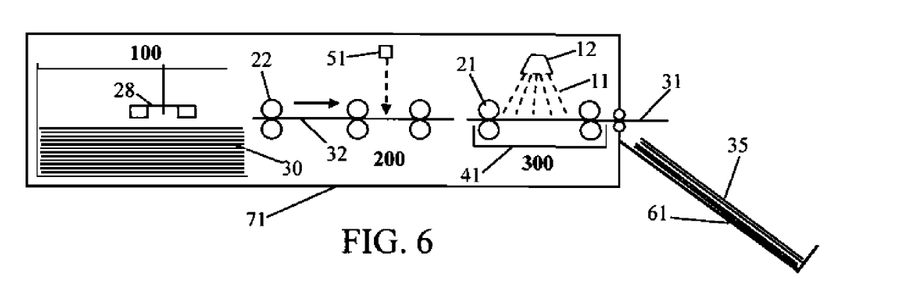
FIG. 6 is a diagrammatic cross-sectional view of a lithographic printing plate imaging and deactivation assembly of the invention comprising a flatbed laser imager and a deactivating device, as well as a plate cassette for automatically feeding the plate for imaging and a collecting tray for the deactivated plates; wherein the plates in the cassette, on the imager, and on the deactivating device are shielded with covers (or cover) which prevent all or substantially all room light from reaching the plate.

FIG. 6 is a diagrammatic cross-sectional view of a lithographic printing plate imaging and deactivation assembly of the invention comprising a flatbed laser imager 200 and a deactivating device 300, as well as a plate cassette 100 for automatically feeding the plate for imaging and a collecting tray 61 for the deactivated plates 35; wherein the plates in the cassette, on the imager, and on the deactivating device are shielded with covers (or cover) 71 which prevent all or substantially all room light from reaching the plate.

Figure 7:
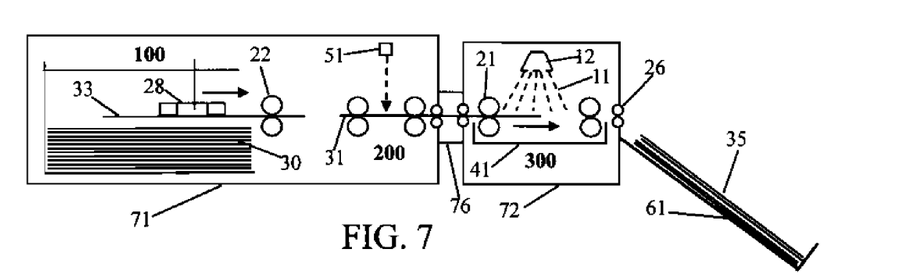
FIG. 7 is a diagrammatic cross-sectional view of a lithographic printing plate imaging and deactivation assembly of the invention comprising a flatbed laser imager and a deactivating device, as well as a plate cassette for automatically feeding the plate for imaging and a collecting tray for the deactivated plates; wherein the imager and the cassette are covered with a set of covers, the deactivating device is covered with another set of covers, and the imager and the deactivating device are connected with a covered passage, so that no or substantially no room light reaches the plates while in the cassette, on the imager, and on the deactivating device.

FIG. 7 is a diagrammatic cross-sectional view of a lithographic printing plate imaging and deactivation assembly of the invention comprising a flatbed laser imager 200 having a laser 51 and a deactivating device 300 having a spraying unit 12 for applying a deactivating agent 11, as well as a plate cassette 100 for automatically feeding the plate 33 for imaging and a collecting tray 61 for the deactivated plates 35; wherein the imager and the cassette are covered with a set of covers 71, the deactivating device is covered with another set of covers 72, and the imager and the deactivating device are connected with a covered passage 76, so that no or substantially no room light reaches the plates 33 and 31 while in the cassette, on the imager, and on the deactivating device.

Figure 8:
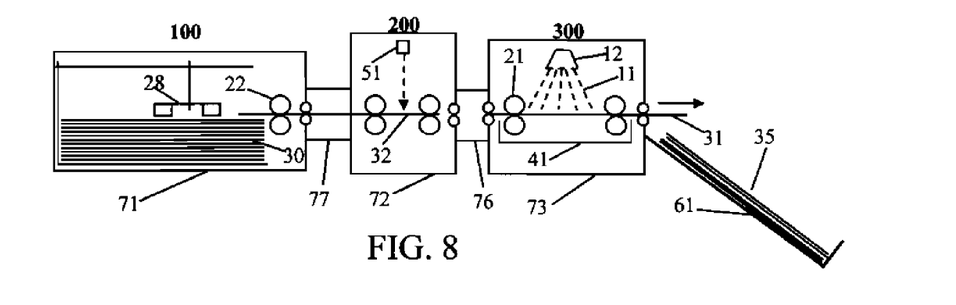
FIG. 8 is a diagrammatic cross-sectional view of a lithographic printing plate imaging and deactivation assembly of the invention comprising a flatbed laser imager and a deactivating device, as well as a plate cassette for automatically feeding the plate for imaging and a collecting tray for the deactivated plates; wherein the imager, deactivating device, and the cassette are each covered with a different set of covers which are connected with each other with covered passages.

FIG. 8 is a diagrammatic cross-sectional view of a lithographic printing plate imaging and deactivation assembly of the invention comprising a flatbed laser imager 200 having a laser 51 and a deactivating device 300 having a spraying unit 12 for applying a deactivating agent 11, as well as a plate cassette 100 for automatically feeding the plate 31 for imaging and a collecting tray 61 for the deactivated plates 35; wherein the imager, the deactivating device, and the cassette are each covered with a different set of covers 71-73 which are connected with each other with covered passages 76-77.

Figure 9:
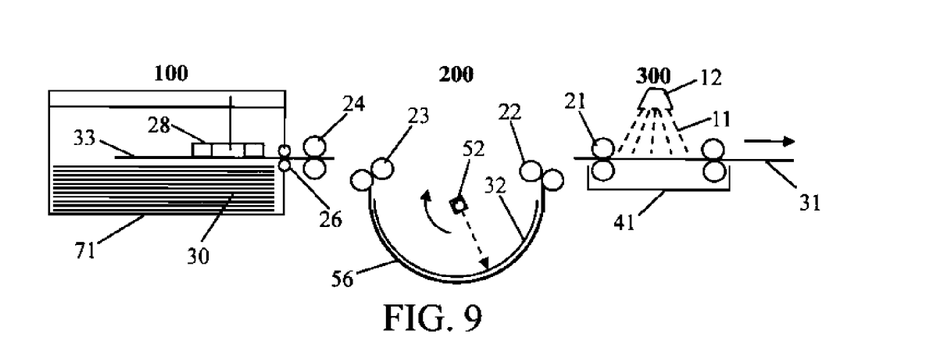
FIG. 9 is a diagrammatic cross-sectional view of a lithographic printing plate imaging and deactivation assembly of the invention comprising an internal drum laser imager and a deactivating device, as well as a plate cassette for automatically feeding the plate for imaging; wherein the cassette is shielded with covers which prevent substantially all of the room light or of the unsafe portion of the room light from reaching the plate.

FIG. 9 is a diagrammatic cross-sectional view of a lithographic printing plate imaging and deactivation assembly of the invention comprising an internal drum laser imager 200 having a laser 52 exposing a plate 32 in a drum 56 and a deactivating device 300 having a spraying unit 12 for applying a deactivating agent 11, as well as a plate cassette 100 for automatically feeding the plate 33 for imaging; wherein the cassette is shielded with covers 71 which prevent substantially all of the room light or of the unsafe portion of the room light from reaching the plates 30.

Figure 10:
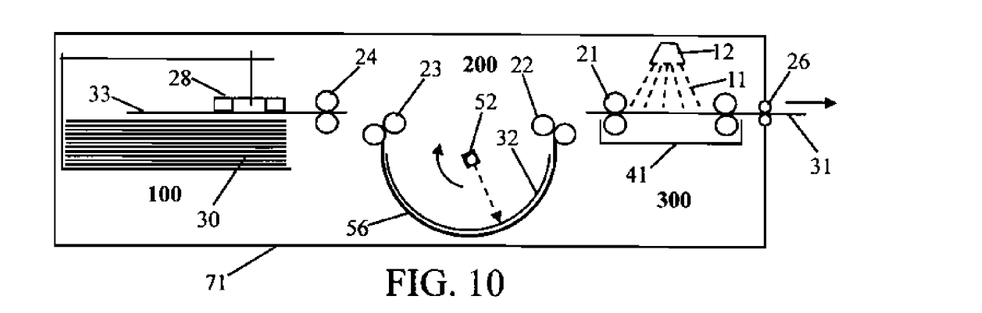
FIG. 10 is a diagrammatic cross-sectional view of a lithographic printing plate imaging and deactivation assembly of the invention comprising an internal drum laser imager and a deactivating device, as well as a plate cassette for automatically feeding the plate for imaging; wherein the cassette the imager, and the deactivating device are shielded with covers which prevent substantially all of the room light or of the unsafe portion of the room light from reaching the plates in the cassette, on the imager, and on the deactivating device.

FIG. 10 is a diagrammatic cross-sectional view of a lithographic printing plate imaging and deactivation assembly of the invention comprising an internal drum laser imager 200 and a deactivating device 300, as well as a plate cassette 100 for automatically feeding the plate 33 for imaging; wherein the cassette, the imager, and the deactivating device are shielded with covers 71 which prevent substantially all of the room light or of the unsafe portion of the room light from reaching the plates 30-33 in the cassette, on the imager, and on the deactivating device.

Figure 11:
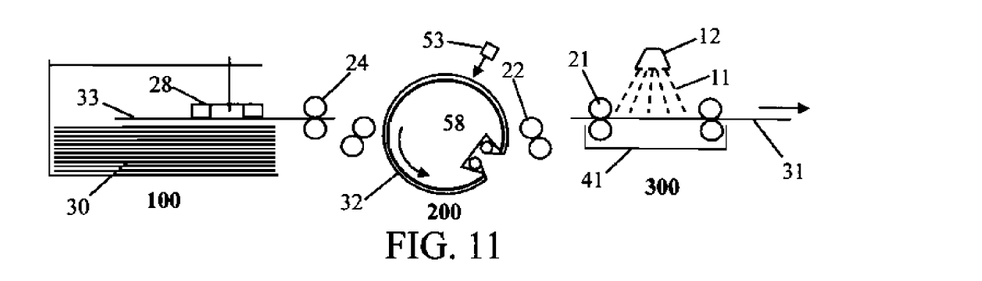
FIG. 11 is a diagrammatic cross-sectional view of a lithographic printing plate imaging and deactivation assembly of the invention comprising an external drum laser imager and a deactivating device, as well as a plate cassette for automatically feeding the plate for imaging.

FIG. 11 is a diagrammatic cross-sectional view of a lithographic printing plate imaging and deactivation assembly of the invention comprising an external drum laser imager 200 and a deactivating device 300, as well as a plate cassette 100 for automatically feeding the plate 33 for imaging. The plate 32 mounted on the external drum 58 is exposed with a laser 53.

Figure 12:
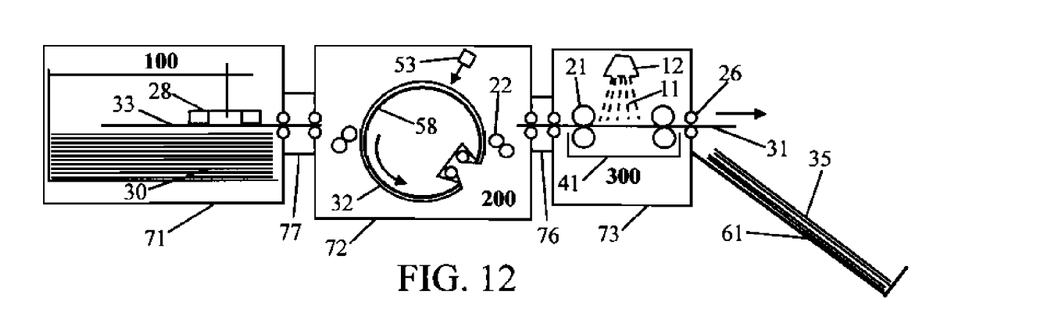
FIG. 12 is a diagrammatic cross-sectional view of a lithographic printing plate imaging and deactivation assembly of the invention comprising an external drum laser imager and a deactivating device, as well as a plate cassette for automatically feeding the plate for imaging and a collecting tray for keeping the deactivated plates; wherein the cassette, the imager, and the deactivating device are shielded with covers which prevent substantially all of the room light or of the unsafe portion of the room light from reaching the plates in the cassette, on the imager, and on the deactivating device.

FIG. 12 is a diagrammatic cross-sectional view of a lithographic printing plate imaging and deactivation assembly of the invention comprising an external drum laser imager 200 and a deactivating device 300, as well as a plate cassette 100 for automatically feeding the plate for imaging and a collecting tray 61 for keeping the deactivated plates; wherein the cassette, the imager, and the deactivating device are shielded with covers 71-73 which prevent substantially all of the room light or of the unsafe portion of the room light from reaching the plates in the cassette, on the imager, and on the deactivating device.

The imagewise exposed plate can be directly applied with a deactivating agent on a deactivating device. Alternatively, the exposed plate can be heated to an elevated temperature (preferably 50 to 200° C. for 1 to 600 seconds, more preferably 70 to 150° C. for 1 to 60 seconds) to further harden or solubilize the photosensitive layer in the exposed areas, before applied with a deactivating agent. The heat can be applied to the plate by any means, such as forced hot air, contacting the back of the plate with a heated material, exposing the back of the plate with a radiation such as an infrared radiation, exposing the front of the plate (having photosensitive layer) with a radiation which has different wavelength from the laser and does not cause hardening of the photosensitive layer.

After the deactivation process, the plate can be further applied with heat or forced hot air to dry off any water on the plate or to further harden the photosensitive layer in the hardened or non-solubilized areas. In addition to forced hot air, ambient (non-heated) air blow can be utilized to dry off the water (and solvent if any). Preferably, forced hot air is used to dry off the water.

For plate with a water soluble or dispersible overcoat, the plate can be rinsed with water or other aqueous solution, to remove the water soluble or dispersible overcoat after imagewise exposure and before development. The plate can be rinsed with water before or after deactivation, preferably before deactivation. For plate applied with heat after laser exposure, the plate can be rinsed with water before or after the heating process, preferably after the heating process.

The laser exposure and deactivation of this invention are preferably performed with the plate in substantial darkness or under lightings that will not cause hardening or solubilization of the photosensitive layer at least within a limited time (such as less than 60 minutes) required for handling and processing the plate before being deactivated. More preferably, these are performed with the plate under a yellow or red light, under a white light for less than 60 minutes (more preferably less than 20 minutes and most preferably less than 10 minutes), or in darkness or substantial darkness. Most preferably, these are performed with the plate under a yellow or red light, or in darkness or substantial darkness. The laser exposure and the deactivation can be performed with the plate under the same or different lightings (including darkness). The lighting can be the room light when the plate is open to the room light, or can be the lighting (including darkness) within the covers when the plate is shielded with covers.

During the manual or automatic handling before deactivation, the plate is preferably under a yellow or red light (such as open to a yellow or red room light or shielded with yellow or red light-passing-only covers), under a while light for less than 60 minutes (more preferably less than 20 minutes and most preferably less than 10 minutes), and/or in darkness or substantial darkness (such as shielded with light-tight or substantially light-tight covers); and more preferably under a yellow or red light and/or in darkness or substantial darkness. During the manual handling before deactivation, the plate is preferably open to a yellow or red room light, or open a white room light for less than 60 minutes (more preferably less than 20 minutes and most preferably less than 10 minutes); and more preferably open a yellow or red light. During the automatic handling before deactivation, the plate is preferably shielded with covers (which are substantially light-tight or yellow or red light-passing-only), open to a yellow or red room light, or open a white room light for less than 60 minutes (more preferably less than 20 minutes and most preferably less than 110 minutes); and more preferably shielded with light-tight or substantially light-tight covers.

Before being deactivated, the plate is preferably handled and/or stored in darkness or substantial darkness (such as in a light-tight or substantially light-tight box, wrap or cassette), under white light for limited time (such as less than 30 minutes), or under a yellow or red light (preferably for limited time, such as less than 2 hours). More preferably, the plate is handled and/or stored in darkness or substantial darkness, or under a yellow or red light for limited time (such as less than 2 hours, preferably less than 1 hour). Most preferably, the plate is stored in darkness, and handled in darkness or substantial darkness or under a yellow or red light. The time allowable under white light or yellow or red light depends on the particular plate; for example, some plates are unsafe under regular office light for even 1 second, some plates are safe under regular office light for up to 10 minutes, some plates are safe under a yellow or red light for up to 60 minutes, and some plates are safe under a yellow or red light for more than 2 hours. Here the term safe means maintaining acceptable performance.

The development can be performed with the plate under any lighting (including darkness), preferably with the plate under a visible light (with the plate open to the white or other visible room light or shielded with substantially light-tight or yellow or red light-passing-only covers), more preferably with the plate open to the room light (of any color), and most preferably with the plate open to a white room light. For on-press ink and/or fountain solution developable plate, the plate is preferably developed on a lithographic press under a white room light, wherein the plate is not fully covered so that the operator can observe the plate directly.

In a preferred embodiment for the lightings of this invention, the imaging and deactivation are performed with the plate under lightings (including darkness) that will not cause hardening or solubilization of the photosensitive layer, and the development is performed under a lighting that will cause hardening or solubilization of the non-deactivated photosensitive layer. The deactivation allows the plate to be handled and developed under a lighting which is otherwise unsafe (causing hardening or solubilization) to the original, non-deactivated photosensitive layer.

In a second preferred embodiment for the lightings of the invention, the imaging and deactivation are performed with the plate under a yellow or red light, or in darkness or substantial darkness; and said development is performed under a white light. Here, the imaging and deactivation can be under different or the same lightings (including darkness).

In a third preferred embodiment for the lightings of the invention, the plate is handled and/or processed in the same visible light room for the imaging, deactivation, and development, and the total exposure time to the room light before the plate being deactivated is short enough so that the imagewise non-exposed areas of the photosensitive layer of the plate are not hardened (for negative plate) or not solubilized (for positive plate). The total exposure time to the room light before the plate being deactivated is preferably less than 60 minutes, more preferably less than 20 minutes, and most preferably less than 10 minutes. It is noted that the imager and the deactivating device can be open to the room light, or partially or fully shielded with light-tight or substantially light-tight covers, so that the plate may see the room light either only part of the time or all the time during imaging, deactivation and the related handling. Here "not hardened" means that the imagewise non-exposed areas of the photosensitive layer are still capable of development with a regular developer or with ink and/or fountain solution for a negative plate, and "not solubilized" means that the imagewise non-exposed areas of the photosensitive layer are still incapable of development with a regular developer or with ink and/or fountain solution for a positive plate. The room light can be any light that will cause hardening or solubilization of the photosensitive layer if exposed to the light for more than a certain amount of time (such as 30 minutes). Preferably, the room light is a white light.

In a fourth preferred embodiment for the lightings of the invention, the plate is handled and processed on an imager, a deactivating device, and a lithographic press in a white light or yellow or red light room (preferably a white light room), and the total exposure time to the room light before the plate being deactivated is short enough so that the imagewise non-exposed areas of the photosensitive layer of the plate are not hardened (for negative plate) or not solubilized (for positive plate). Here the plate on the imager, the deactivating device and/or the lithographic press is either fully or partially open to the room light or shielded with non-transparent, semitransparent or color-filtering covers. The total exposure time to the room light before the plate being deactivated is preferably less than 60 minutes, more preferably less than 20 minutes, and most preferably less than 10 minutes. Such a process is especially suitable for an on-press ink and/or fountain solution developable plate with moderate stability under white light, such as up to 30 minutes; the deactivation allows the imaged plate to be handled and stored freely under white light before being on-press developed.

In a fifth preferred embodiment for the lightings of the invention, the plate is a negative laser sensitive on-press developable plate comprising on a substrate a photosensitive layer; is handled and processed on a laser imager, a deactivating device, and a lithographic press in a yellow or red light or white light room (preferably a white light room); and the total exposure time to the room light before the plate being deactivated is short enough so that the imagewise non-exposed areas of the photosensitive layer of the plate are not hardened. The total exposure time to the room light before the plate being deactivated is preferably less than 60 minutes, more preferably less than 20 minutes, and most preferably less than 10 minutes. Here the plate on the imager, the deactivating device and/or the lithographic press is either fully or partially open to the room light or shielded with non-transparent, semitransparent or color-filtering covers; preferably, the plate on the lithographic press is open to the room light.

In a sixth preferred embodiment for the lightings of the invention, the plate is a negative infrared laser sensitive on-press developable plate comprising on a substrate a thermosensitive layer; is handled and processed on an infrared laser imager, a deactivating device, and a lithographic press in a white light room; and the total exposure time to the room light before the plate being deactivated is short enough so that the imagewise non-exposed areas of the photosensitive layer of the plate are not hardened. The total exposure time to the white room light before the plate being deactivated is preferably less than 60 minutes, more preferably less than 20 minutes, and most preferably less than 10 minutes. Here the plate on the imager, deactivating device and/or lithographic press is either fully or partially open to the room light or shielded with non-transparent, semitransparent or color-filtering covers; preferably, the plate on the lithographic press is open to the room light.

In a seventh preferred embodiment for the lightings of the invention, the plate is imaged on a laser imager and deactivated with a deactivating device in a yellow or red light room. The plate is manually or automatically handled between the imager and deactivating device. The imager and/or the deactivating device can stay open to the room light, or can be fully or partially shielded with light-tight or substantially light-tight covers. The development is performed in a white light room or a yellow or red light room, preferably in a white light room.

In an eighth preferred embodiment for the lightings of the invention, the room light is a white light; and the plate is packaged in a light-tight or substantially light-tight or yellow or red-light-passing-only cassette to feed to the imager that is shielded with light-tight or substantially light-tight or yellow or red-light-passing-only covers; the plate is automatically transferred to the deactivating device that is shielded with light-tight or substantially light-tight or yellow or red-light-passing-only covers; here the cassette and the covers prevent substantially all of the room light or of the unsafe portion of the room light from reaching the plate. Preferably, the cassette and the covers for the imager and deactivating device are light-tight or substantially light-tight. The deactivated plate is further developed in the same white light room with ink and/or fountain solution on a lithographic press or with a liquid developer on a developing processor (which is preferably not connected to the deactivating device), preferably with ink and/or fountain solution.

In this patent, the term yellow or red light means yellow light, red light, or any light with color between yellow and red such as orange light. The term safe light means a light with a certain wavelength range being cut off so that it does not cause hardening (for negative plate) or solubilization (for positive plate) of a certain photosensitive layer at least within a certain amount of time required for certain typical handling and process (such as 2 hours). For most photosensitive layer, a safe light is a yellow or red light. The term white light means a white fluorescent light, white incandescent light, sunlight, or any regular office light. The term "substantially no radiation" means the intensity of the radiation is less than 1% of that for a regular 100-watt incandescent light (for home use, not focused) at a distance of 2 meters. The term "substantial darkness" means the intensity of the radiation is less than 1% of that for a 100-watt incandescent light at a distance of 2 meters. The term "substantially light-light" means less than 1% of the light can pass through. The term "substantially no room light reaches the plate" means less than 1% of the room light reaches the plate. The term monomer includes both monomer and oligomer, and the term (meth)acrylate includes both acrylate and methacrylate (A monomer means a monomer or an oligomer, and a (meth)acrylate monomer means an acrylate monomer, a methacrylate monomer, or a monomer with both acrylate and methacrylate groups). The term monomer to polymer weight ratio means the weight ratio of all the monomers to all the polymeric binders. Here polymeric binders are solid film-forming polymers; a liquid polymer such as nonionic surfactant is not considered polymeric binder and is not included in the monomer to polymer weight ratio calculation. The term "comprises a . . . " means "comprises at least one . . . "; for example, the term "comprising a monomer" means "comprising at least one monomer."

The deactivating agent can be any material that can deactivate the photo hardening capability (for negative plate) or photo solubilization capability (for positive plate) of the photosensitive layer. It can be a solid or liquid organic or inorganic compound, such as organic or inorganic acid, base, oxidizer, or reducer. The deactivating agent can be applied from a solution (based on water or organic solvent) to the photosensitive layer (with or without overcoat). Preferably, the deactivating agent is soluble in water and is applied from an aqueous solution. A water-soluble organic solvent, such as ethylene glycol, can be added into the aqueous solution. Certain additives, such as dye, dispersed pigment, bactericide, stabilizer, reducer, thickening agent, and surfactant, can be added. The aqueous deactivating solution preferably has a concentration of from 0.01 to 70%, more preferably from 0.1 to 30%, and most preferably from 1 to 10% by weight of the solution.

For free radical polymerizable photosensitive layer, the deactivating agent can be a compound that can react with a component of the free radical initiating system (such as initiator, sensitizing dye, hydrogen donor, or monomer; preferably the initiator, sensitizing dye, or hydrogen donor). For cationic polymerizable photosensitive layer, the deactivating agent can be a compound that can react with a component of the cationic polymerization system (such as the initiator which is an acid generator, sensitizing dye, or monomer; preferably the initiator or sensitizing dye). For acid catalyzed positive-working novalac system, the deactivating agent can be a compound that can react with a component of the decomposition reaction system (such as the latent acid, the novolac resin, or the sensitizing dye; preferably the latent acid or sensitizing dye).

For polymerizable photosensitive layer having an amine group in the initiator, sensitizing dye, or hydrogen donor, an acid compound (including organic acid and inorganic acid) can be used as the deactivating agent. Suitable organic acids include, for example, organic compounds having at least one carboxylic acid group, a sulfonic acid group, or phosphonic acid group. Suitable inorganic acids include, for example, phosphoric acid, boric acid, and hydrochloride acid. Preferred acids are those with moderate acidity, such as organic compounds with at least one carboxylic acid group, phosphoric acid, and boric acid. More preferred are water soluble organic acids. Most preferred are water-soluble organic compounds having at least one carboxylic acid group. Suitable organic acids include, for example, citric acid, acetic acid, salicylic acid, glycolic acid, malic acid, and lactic acid. Citric acid and malic acid are particularly suitable because they are widely used natural organic acids and are non-hazardous to the environment. The acid is preferably applied as an aqueous solution to deactivate the photosensitive layer. When strong acid (such as hydrochloric acid) is used as deactivating agent, it is preferably diluted to low concentration (such as less than 0.5%, preferably less than 0.1% by weight) in an aqueous solution to apply to the plate so that it does not damage the plate or cause safety problem. The acidic deactivating solution preferably has a pH of from 0.1 to 6.5, more preferably from 0.5 to 5.0, and most preferably from 1.0 to 4.0. The acidic deactivating solution preferably has a concentration of from 0.01 to 70%, and more preferably from 0.05 to 30% by weight of the solution. The aqueous acidic deactivating solution based on organic acid preferably has a concentration of from 0.1 to 70%, more preferably from 0.5 to 30%, and most preferably from 2 to 10% by weight of the solution.

An alkaline compound can also be used as the deactivating agent for certain negative plates with free radical or cationic polymerizable or other acid crosslinkable photosensitive layers because it can react with certain free radical initiating system (such as initiator, sensitizing dye, or hydrogen donor), certain cationic initiating system (such as initiator which is an acid generator, or sensitizing dye), and other acid crosslinkable systems (such as negative-working diazonaphthoquinone systems). For example, an alkaline compound can react with an ionic initiator such as an onium salt, an ionic sensitizing dye such as a cyanine dye, or a hydrogen donor having carboxylic acid or thiol group; and can also neutralize with a cationic initiator which is an acid generator. Suitable alkaline compounds include, for example, sodium silicate, potassium silicate, sodium carbonate, sodium hydroxide, and organic amines. Preferred alkaline compounds are water-soluble compounds with moderate basicity, such as sodium silicate, potassium silicate, ammonium hydroxide, and amines. More preferred amines are organic amines, including polymeric amines. Suitable water-soluble amines include regular amine compounds such as triethylamine, triethanolamine, 2-amino-2-methyl-1-propanol, tris(hydroxymethyl) aminomethane and N-methyl-2-pyrrolidone, and polymeric amines such as polyethyleneamine. The alkaline compound is preferably applied as an aqueous solution to deactivate the photosensitive layer. When strong base (such as sodium hydroxide) is used as deactivating agent, it is preferably diluted to low concentration (such as less than 0.5%, preferably less than 0.1% by weight) in an aqueous solution so that it does not damage the plate or cause safety problem. The alkaline deactivating solution preferably has a pH of from 7.5 to 13.5, more preferably from 8.0 to 12.0, and most preferably from 9.0 to 11.0. The alkaline deactivating solution preferably has a concentration of from 0.01 to 70%, and more preferably from 0.05 to 30% by weight of the solution. The aqueous alkaline deactivating solution based on organic amine preferably has a concentration of from 0.1 to 70%, more preferably from 0.5 to 30%, and most preferably from 2 to 10% by weight of the solution.

For positive plate with the photosensitive layer capable of solubilization upon exposure to a radiation as well as under a room light through the mechanism of acid catalyzed decomposition (such as positive plates based on a novalac resin and an acid generator), an alkaline compound can be used as the deactivating agent. Suitable alkaline compounds include, for example, sodium silicate, potassium silicate, sodium carbonate, sodium hydroxide, and organic amines. Preferred alkaline compounds are water-soluble compounds with moderate basicity, such as sodium silicate, potassium silicate, ammonium hydroxide, and amines. More preferred amines are organic amines, including polymeric amines. Suitable water-soluble amines include regular amine compounds such as triethylamine, triethanolamine, 2-amino-2-methyl-1-propanol, tris(hydroxymethyl)aminomethane and N-methyl-2-pyrrolidone, and polymeric amines such as polyethyleneamine. The alkaline compound is preferably applied as an aqueous solution to deactivate the photosensitive layer. The alkaline deactivating solution preferably has a pH of from 7.5 to 13.5, more preferably from 8.0 to 12.0, and most preferably from 9.0 to 11.0. The alkaline deactivating solution preferably has a concentration of from 0.01 to 70%, and more preferably from 0.05 to 30% by weight of the solution. The aqueous alkaline deactivating solution based on organic amine preferably has a concentration of from 0.1 to 70%, more preferably from 0.5 to 30%, and most preferably from 2 to 10% by weight of the solution.

A free radical inhibitor can be used as the deactivating agent for plates with a free radical polymerizable photosensitive layer. Examples of suitable free radical inhibitors include methoxyhydroquinone, hydroquinone, 2,6-di-tert-butyl-4-methylphenol, polyvinylphenol, other compounds with at least one phenol group, and various commercial free radical stabilizer. Preferably, the inhibitor is dissolved in water or a water-solvent mixture (containing water and a water soluble organic solvent) to form an aqueous deactivating solution for applying to the plate. The deactivating solution based on a free radical inhibitor preferably has a concentration of from 0.1 to 70%, more preferably from 0.5 to 30%, and most preferably from 2 to 10% by weight of the solution.

The solution containing the deactivating agent can be applied to the photosensitive layer of the plate through any means, such as spray, dipping, roller coating, slot coating, etc. For plate with an overcoat, the deactivating solution can be applied with or without the overcoat being removed first. When the overcoat is not removed before applying the deactivating solution, the deactivating solution may penetrate through the overcoat without removing the overcoat, or partially or completely remove the overcoat.

The substrate employed in the lithographic plates of this invention can be any lithographic support. Such a substrate may be a metal sheet, a polymer film, or a coated paper. Aluminum (including aluminum alloy) sheet is a preferred metal support. Particularly preferred is an aluminum support that has been grained and anodized (with or without deposition of a barrier layer). Polyester film is a preferred polymeric support. A surface coating may be coated to achieve desired surface properties. For wet plate, the substrate should have a hydrophilic surface (for oleophilic photosensitive layer) or oleophilic surface (for hydrophilic photosensitive layer); preferably, a wet lithographic plate has a hydrophilic substrate and an oleophilic photosensitive layer. For waterless plate, the substrate should have an oleophilic surface (for oleophobic photosensitive layer) or oleophobic surface (for oleophilic photosensitive layer).

Particularly suitable hydrophilic substrate for a wet lithographic plate is an aluminum support that has been grained and anodized, preferably with further hydrophilic treatment. Surface graining can be achieved by mechanical graining or brushing, chemical etching, and/or AC electrochemical graining. The grained aluminum is typically treated with a basic or acidic solution to remove the smut, and then subjected to an electrochemical anodization process utilizing an acid such as sulfuric acid and/or phosphoric acid. The roughened and anodized aluminum surface can be further treated with a hydrophilic material to form a hydrophilic barrier layer. Suitable hydrophilic materials include metal silicate such as sodium silicate, phosphate fluoride (formed from a solution containing sodium dihydrogen phosphate and sodium fluoride), phosphoric acid, and hydrophilic polymer such as polyvinyl phosphonic acid, polyacrylamide, polyacrylic acid, polybasic organic acid, copolymers of vinyl phosphonic acid and acrylamide. Polyvinyl phosphonic acid and its copolymers are preferred hydrophilic polymers. The hydrophilic material can be formed on the aluminum surface by thermal or electrochemical method. By thermal method, the grained and anodized aluminum passes through or is immersed for a certain time in a solution containing the hydrophilic material at a certain temperature including elevated and room temperature. By electrochemical method, a DC or AC electricity is applied to the aluminum while passing through or immersed in the solution containing the hydrophilic material. Processes for surface graining, anodization, and hydrophilic treatment of aluminum in lithographic printing plate application are well known in the art, and examples can be found in U.S. Pat. Nos. 2,714,066, 4,153,461, 4,399,021, 5,368,974, and 6,555,205.

For preparing lithographic printing plates of the current invention, any photosensitive layer is suitable which is capable of hardening (for negative plate) or solubilization (for positive plate) upon exposure to a radiation having a wavelength selected from 200 to 1200 nm, and is soluble or dispersible in ink and/or fountain solution or in a regular liquid developer. Here hardening means becoming insoluble and non-dispersible in ink and/or fountain solution or in a regular liquid developer (negative-working); and solubilization means becoming soluble or dispersible in ink and/or fountain solution or in a regular liquid developer (positive-working). In this invention, hardening or solubilization can be achieved through any means. Preferably, hardening is achieved through crosslinking or polymerization of polymers and/or monomers, and solubilization is achieved through decomposition of polymer and/or compound. The radiation can be a conventional light such as ultraviolet light from a lamp (which usually requires a photomask), or can be a laser (which directly images according to digital imaging information). Preferably, the photosensitive layer is sensitive to a laser and exposed with such laser. The photosensitive layer preferably has a coverage of from 100 to 4000 mg/m$^2$, and more preferably from 400 to 2000 mg/m$^2$.

Photosensitive materials useful for negative-working wet plates of this invention include, for example, photopolymers (comprising acrylic monomers, polymeric binders, and photoinitiators), light-sensitive compositions comprising polyfunctional vinyl ethers or epoxy monomers and cationic photoinitiators, and polycondensation products of diazonium salts.

Photosensitive materials useful for positive-working wet plates of this invention include, for example, diazo-oxide compounds such as benzoquinone diazides and naphthoquinone diazides, and positive-working novalac systems such as a thermosensitive layer based on combination of a novalac resin and an infrared absorbing dye.

Photosensitive materials useful for wet plates of this invention include, for example, photosensitive compositions comprising an oleophilic polymeric binder, a polymerizable monomer, an initiator, and optionally a sensitizing dye.

Photosensitive oleophobic materials useful for waterless plates of this invention include, for example, compositions comprising polymers having perfluoroalkyl groups and crosslinkable terminal groups, and compositions comprising polysiloxane and crosslinkable resins.

Infrared laser sensitive (also called thermosensitive) materials useful for thermosensitive lithographic plates of this invention include, for example, thermosensitive compositions comprising a polymerizable monomer, an initiator, an infrared absorbing dye, and optionally a polymeric binder.

Visible or ultraviolet light sensitive materials useful for visible or ultraviolet laser sensitive plates of this invention include, for example, photosensitive compositions comprising a polymerizable monomer, an initiator, a visible or ultraviolet light sensitizing dye, and optionally a polymeric binder. A hydrogen donor is preferably added to accelerate the polymerization.

Polymeric binder for the photosensitive layer of this invention can be any solid film-forming polymer. The polymer may or may not have (meth)acrylate groups or other ethylenic groups (such as allyl groups). Examples of suitable polymers include (meth)acrylic polymers and copolymers (such as polybutylmethacrylate, polyethylmethacrylate, polymethylmethacrylate, polymethylacrylate, butylmethacrylate/methylmethacrylate copolymer, methylmethacrylate/methylmethacrylic acid copolymer, polyallylmethacrylate, and allylmethacrylate/methacrylic acid copolymer), polyvinyl acetate, polyvinyl butyrate, polyvinyl chloride, styrene/acrylonitrile copolymer, styrene/maleic anhydride copolymer and its partial ester, nitrocellulose, cellulose acetate butyrate, cellulose acetate propionate, vinyl chloride/vinyl acetate copolymer, butadiene/acrylonitrile copolymer, and polyurethane binder. Polymeric binders having polymer backbone with recurring units having pendant poly(alkylene glycol) side chains are particularly useful for on-press developable plates of this invention. The polymeric binder suitable for the photosensitive layer of this invention has a weight average molecular weight of at least 5,000, preferably from 10,000 to 1,000,000, more preferably from 20,000 to 500,000, and most preferably from 50,000 to 200,000 Dalton. It is noted that polymeric compounds with weight average molecular weight of less that 5,000 can also be added in the photosensitive layer of this invention; however, in order to avoid confusion, such compounds are not considered as polymeric binder and are called oligomer (without or with ethylenic groups) in this application (oligomers having ethylenic groups are also included in the definition of monomers in this application).

Suitable free-radical polymerizable monomers include any monomer or oligomer with at least one ethylenically unsaturated group. Such monomers include monofunctional, difunctional, and multifunctional (meth)acrylate monomers or oligomers, such as (meth)acrylate esters of ethylene glycol, trimethylolpropane, pentaerythritol, ethoxylated ethylene glycol and ethoxylated trimethylolpropane; multifunctional urethanated (meth)acrylate; epoxylated (meth) acrylate; and oligomeric amine (meth)acrylates. The monomers can be urethane (meth)acrylate, or non-urethane (meth)acrylate. Combination of both urethane (meth)acrylate and non-urethane (meth)acrylate monomers can be used. The monomers preferably has at least 3 (meth)acrylate groups, more preferably at least 4 (meth)acrylate groups, even more preferably at least 5 (meth)acrylate groups, and most preferably at least 6 (meth)acrylate groups. However, monofunctional or difunctional (meth)acrylate monomer can be added into the photosensitive layer having multifunctional (meth) acrylate monomers; the total amount of such monofunctional or difunctional monomers is preferably less than 50% by weight of the total monomers, more preferably less than 30%, and most preferably less than 10%. Acrylate monomer is preferred over methacrylate monomer because of the faster photospeed of acrylate group over methacrylate group. The monomer has a molecular weight of less than 5,000, preferably from 100 to 3,000, more preferably from 200 to 2,000, and most preferably from 300 to 1,500 Dalton.

Urethane (meth)acrylate monomers include any compounds having at least one urethane linkage (—NHCOO—) and at least one (meth)acrylate group. Preferred urethane (metha)acrylate monomers are those with at least 3 (meth) acrylate groups, more preferably at least 4 (meth)acrylate groups, even more preferably at least 5 (meth)acrylate groups, and most preferably at least 6 (meth)acrylate groups. Urethane (meth)acrylate monomer is usually formed by reacting a compound having at least one isocyanate group with a (meth)acrylate compound having a hydroxy group. Urethane monomer with 2 or more (meth)acrylate groups are usually formed from a compound having one or more isocyanate groups and a (meth)acrylate compound having a hydroxy group and one or more (meth)acrylate groups. For example, a tetrafunctional urethane (meth)acrylate monomer can be formed from a compound having one hydroxy group and 2 (meth)acrylate groups with a bifunctional isocyanate compound. Suitable isocyanate compounds include, for example, aromatic diisocyanate such as p-phenylene diisocyanate, 2,4-tolylene diisocyanate, 2,6-tolylene diisocyanate, 4,4'-diphenylmethane diisocyanate, naphthalene-1,5-diisocyanate and tolydine diisocyanate; aliphatic diisocyanate such as hexamethylene diisocyanate, lysinemethyl ester diisocyanate, 2,4,4-trimethylhexamethylene diisocyanate and dimer acid diisocyanate; alicyclic diisocyanate such as isophorone diisocyanate, and 4,4'-methylenebis(cyclohexylisocyanate); aliphatic diisocyanate having an aromatic ring, such as xylylene diisocyanate; triisocyanate such as lysine ester triisocyanate, 1,6,11-undecane triisocyanate, 1,8-diisocyanate-4-isocyanatemethyloctane, 1,3,6-hexamethylene triisocyanate, bicycloheptane triisocyanate, tris(isocyanate phenylmethane) and tris(isocyanatephenyl)thiophosphate; and polyisocyanate formed from condensation of three or more diisocyanate compounds such as 2,4-tolylene diisocyanate isocyanurate trimer, 2,4-tolylene diisocyanate-trimethylolpropane adduct, 1,6-hexanediisocyanate isocyanurate trimer. Suitable (meth)acrylate compounds with one hydroxy group include pentaerythritol tri(meth)acrylate, dipentaerythritol penta(meth)acrylate, ditrimethylolpropane tri(meth)acrylate and pentaerythritol di(meth)acrylate monostearate. Various urethane (meth)acrylate monomers are described in U.S. Pat. No. 6,232,038 and U.S. Pat. Pub. No. 2002/0018962, and can be used as the urethane (meth) acrylate monomers of this instant invention. Among the urethane (meth)acrylate monomers, urethane acrylate monomer is preferred. Either aromatic urethane (meth)acrylate monomer (which contains at least one aromatic group in the molecule) or aliphatic urethane (meth)acrylate monomer (which does not contain any aromatic group in the molecule) or both can be used in a photosensitive layer of this invention.

Suitable non-urethane (meth)acrylate monomers can be any (meth)acrylate monomers without urethane linkage (—NHCOO—) in the molecule. Suitable non-urethane (meth)acrylate monomers include, for example, trimethylolpropane triacrylate, pentaerythritol tetra(meth)acrylate, dipentaerythritol penta(meth)acrylate, dipentaerythritol hexa (meth)acrylate, di(trimethylolpropane)tetra(meth)acrylate. Among the non-urethane (meth)acrylate monomers, non-urethane acrylate monomer is preferred.

Suitable free-radical initiators include, for example, the derivatives of acetophenone (such as 2,2-dimethoxy-2-phenylacetophenone, and 2-methyl-1-[4-(methylthio)phenyl]-2-morpholino propan-1-one), onium salts such as diaryliodonium hexafluoroantimonate, diaryliodonium hexafluorophosphate, diaryliodonium triflate, (4-(2-hydroxytetradecyl-oxy)phenyl)phenyliodonium hexafluoroantimonate, (4-octoxyphenyl)phenyliodonium hexafluoroantimonate, bis(4-t-butylphenyl)iodonium hexafluorophosphate, triarylsulfonium hexafluorophosphate, triarylsulfonium p-toluenesulfonate, (3-phenylpropan-2-onyl)triaryl phosphonium hexafluoroantimonate and N-ethoxy(2-methyl)pyridinium hexafluorophosphate, and the onium salts as described in U.S. Pat. Nos. 5,955,238, 6,037,098 and 5,629,354; borate salts such as tetrabutylammonium triphenyl(n-butyl)borate, tetraethylammonium triphenyl(n-butyl)borate, diphenyliodonium tetraphenylborate, and triphenylsulfonium triphenyl(n-butyl)borate, and the borate salts as described in U.S. Pat. Nos. 6,232,038 and 6,218,076; haloalkyl substituted s-triazines such as 2,4-bis(trichloromethyl)-6-(p-methoxy-styryl)-s-triazine, 2,4-bis(trichloromethyl)-6-(4-methoxy-naphth-1-yl)-s-triazine, 2,4-bis(trichloromethyl)-6-piperonyl-s-triazine, and 2,4-bis(trichloromethyl)-6-[(4-ethoxyethylenoxy)-phen-1-yl]-s-triazine, and the s-triazines as described in U.S. Pat. Nos. 5,955,238, 6,037,098, 6,010,824, and 5,629,354; titanocene compounds such as bis($\eta^9$-2,4-cyclopentadien-1-yl)bis[2,6-difluoro-3-(1H-pyrrol-1-yl)phenyl)titanium; hexaarylbiimidazole compounds such as 2,2'-bis(2-chlorophenyl)-4,4',5,5'-tetraphenyl-1,1'-biimidazole, 2,2'-bis(2-ethoxyphenyl)-4,4', 5,5'-tetraphenyl-1,1'-biimidazole, 2-(1-naphthyl)-4,5-diphenyl-1,2'-biimidazole; and derivatives of acetophenone such as 2,2-dimethoxy-2-phenylacetophenone, and 2-methyl-1-[4-(methylthio)phenyl]-2-morpholino propan-1-one. Triarylsulfonium salts, diaryliodonium salts, and triarylalkylborate salts are preferred initiators for infrared laser sensitive plate. Titanocene compounds and hexaarylbiimidazole compounds are preferred initiators for visible or ultraviolet laser sensitive plate, and hexaarylbiimidazole compounds are more preferred. The initiator is added in the photosensitive layer preferably at 0.1 to 40% by weight of the photosensitive layer, more preferably 1 to 30%, and most preferably 5 to 20%.

Infrared sensitizing dyes useful in the infrared sensitive photosensitive layer (also called thermosensitive layer) of this invention include any infrared absorbing dye effectively absorbing an infrared radiation having a wavelength of 750 to 1200 nm. It is preferable that the dye has an absorption maximum between the wavelengths of 780 and 1100 nm. Various infrared absorbing dyes are described in U.S. Pat. Nos. 5,858,604, 5,922,502, 6,022,668, 5,705,309, 6,017,677, and 5,677,106, and in the book entitled "Infrared Absorbing Dyes" edited by Masaru Matsuoka, Plenum Press, New York (1990), and can be used in the thermosensitive layer of this invention. Examples of useful infrared absorbing dyes include squarylium, croconate, cyanine (including polymethine), phthalocyanine (including naphthalocyanine), merocyanine, chalcogenopyryloarylidene, oxyindolizine, quinoid, indolizine, pyrylium and metal dithiolene dyes. Cyanine and phthalocyanine dyes are preferred infrared absorbing dyes. The infrared laser sensitizing dye is added in the photosensitive layer preferably at 0.1 to 20% by weight of the photosensitive layer, more preferably 0.5 to 10%, and most preferably 1 to 5%.

Visible or ultraviolet sensitizing dyes useful in the visible or ultraviolet sensitive photosensitive layer of this invention include any dyes having a wavelength maximum of from 200 to 600 nm. Suitable visible or ultraviolet sensitive dyes include, for example, cyanine dyes; rhodamine compounds such as rhodamine 6G perchloride; chromanone compounds such as 4-diethylaminobenzilidene chromanone; dialkylaminobenzene compounds such as ethyl 4-dimethylaminobenzoate and dialkylaminobenzene; dialkylaminobenzophenone compounds such as 4,4'-bis(dimethylamino)benzophenone, 4,4'-bis(diethylamino)benzophenone, 2-(p-dimethylaminophenyl)benzooxazole, 2-(p-diethylaminophenyl)benzooxazole, 2-(p-dimethylaminophenyl)benzo[4,5]benzooxazole, 2-(p-dimethylaminophenyl)benzo[6,7]benzooxazole, 2,5-bis(p-diethylaminophenyl) 1,3,4-oxazole, 2-(p-dimethylaminophenyl)benzothiazole, 2-(p-diethylaminophenyl)benzothiazole, 2-(p-dimethylaminophenyl)benzimidazole, 2-(p-diethylaminophenyl)benzimidazole, 2,5-bis(p-diethylaminophenyl) 1,3,4-thiadiazole, (p-dimethylaminophenyl)pyridine, (p-diethylaminophenyl)pyridine, 2-(p-dimethylaminophenyl)quinoline, 2-(p-diethylaminophenyl)quinoline, 2-(p-dimethylaminophenyl)pyrimidine or 2-(p-diethylaminophenyl)pyrimidine; unsaturated cyclopentanone compounds such as 2,5-bis{[4-(diethylamino)phenyl]methylene}-(2E,5E)-(9Cl)-cyclopentanone and bis(methylindolenyl)cyclopentanone; coumarin compounds such as 3-benzoyl-7-methoxy coumarin and 7-methoxy coumarin; and thioxanthene compounds such as 2-isopropylthioxanthenone. Dialkylaminobenzene compounds and bis(dialkylamino)benzophenone compounds are particularly suitable for ultraviolet laser sensitive plate. Bis(dialkylamino)benzophenone compounds are particularly suitable for violet laser sensitive plate. The sensitizing dyes as described in U.S. Pat. Nos. 5,422,204 and 6,689,537, and U.S. Pat. App. Pub. No. 2003/0186165 can be used for the photosensitive layer of this invention. The visible or ultraviolet laser sensitizing dye is added in the photosensitive layer preferably at 0.1 to 20% by weight of the photosensitive layer, more preferably 0.5 to 15%, and most preferably 1 to 10%.

The free radical polymerizable photosensitive composition of the present invention preferably contains one or more hydrogen donors as a polymerization accelerator. Examples of the hydrogen donors include compounds having a mercapto group (also called mercapto compounds) such as 2-mercaptobenzothiazole, 2-mercaptobenzimidazole, 2-mercaptobenzoxazole and 3-mercapto-1,2,4-triazole; and N-aryl-α-amino acids, their salts and esters such as N-phenylglycine, salts of N-phenylglycine, and alkyl esters of N-phenylglycine such as N-phenylglycine ethyl ester and N-phenylglycine benzyl ester. Preferred hydrogen donors are 2-mercaptobenzothiazole, 2-mercaptobenzimidazole, 2-mercaptobenzoxazole, 3-mercapto-1,2,4-triazole, N-phenylglycine, N-phenylglycine ethyl ester, and N-phenylglycine benzyl ester. Combination of at least one mercapto compound and at least one N-aryl-α-amino acid or its ester or salt can be advantageously used in the photosensitive layer to increase the photospeed. The hydrogen donor is added in the photosensitive layer preferably at 0.01 to 15% by weight of the photosensitive layer, more preferably 0.1 to 10%, and most preferably 0.5 to 5%.

Various surfactants may be added into the photosensitive layer to, for example, improve the coatability or developability. Both polymeric and small molecule surfactants can be used. However, it is preferred that the surfactant has low or no volatility so that it will not evaporate from the photosensitive layer of the plate during storage and handling. Nonionic surfactants are preferred. Preferred nonionic surfactants are polymers and oligomers containing one or more polyether (such as polyethylene glycol, polypropylene glycol, and copolymer of ethylene glycol and propylene glycol) segments. Examples of preferred nonionic surfactants are block copolymers of propylene glycol and ethylene glycol (also called block copolymer of propylene oxide and ethylene oxide); ethoxylated or propoxylated acrylate oligomers; and polyethoxylated alkylphenols and polyethoxylated fatty alcohols. The nonionic surfactant is preferably added at from 0.1 to 10% by weight of the photosensitive layer, and more preferably from 0.5 to 5%.

For plates with rough and/or porous surface capable of mechanical interlocking with a coating deposited thereon, a thin water-soluble interlayer can be deposited between the substrate and the photosensitive layer. Here the substrate surface is rough and/or porous enough and the interlayer is thin enough to allow bonding between the photosensitive layer and the substrate through mechanical interlocking. Such a plate configuration is described in U.S. Pat. No. 6,014,929, the entire disclosure of which is hereby incorporated by reference. Preferred releasable interlayer comprises a water-soluble polymer. Polyvinyl alcohol (including various water-soluble derivatives of polyvinyl alcohol) is a preferred water-soluble polymer. Usually pure water-soluble polymer is coated. However, one or more surfactants and/or other additives (such as bactericide, defoamer, and water soluble dye) may be added. The releasable interlayer preferably has an average coverage of 1 to 200 mg/m$^2$, more preferably 2 to 100 mg/m$^2$, and most preferably 4 to 40 mg/m$^2$. The substrate preferably has an average surface roughness Ra of 0.2 to 2.0 microns, and more preferably 0.4 to 1.0 microns.

The photosensitive layer may be conformally coated onto a roughened substrate (for example, with Ra of larger than 0.4 microns) at thin coverage (for example, of less than 1.2 g/m$^2$) so that the plate can have microscopic peaks and valleys on the photosensitive layer coated surface and exhibit low tackiness and good block resistance, as described in U.S. Pat. No. 6,242,156, the entire disclosure of which is hereby incorporated by reference.

A water soluble or dispersible overcoat can be coated on the photosensitive layer to, for example, improve the photospeed, surface durability, and/or on-press developability of the plate. The overcoat preferably comprises a water-soluble polymer, such as polyvinyl alcohol (including various water-soluble derivatives of polyvinyl alcohol). Combination of two or more water-soluble polymers (such as a combination of polyvinyl alcohol and polyvinylpyrrolidone) may also be used. Polyvinyl alcohol is a preferred water-soluble polymer. Various additives, such as surfactant, wetting agent, defoamer, leveling agent and dispersing agent, can be added into the overcoat formulation to facilitate, for example, the coating or development process. Examples of surfactants useful in the overcoat of this invention include polyethylene glycol, polypropylene glycol, and copolymer of ethylene glycol and propylene glycol, polysiloxane surfactants, perfluorocarbon surfactants, alkylphenyl ethylene oxide condensate, sodium dioctylsulfosuccinate, sodium dodecylbenzenesulfonate, and ammonium laurylsulfate. Various organic or inorganic micro particles (such as talc and polymer particles) can be added into the overcoat to, for example, reduce the tackiness or moisture sensitivity of the plate. The overcoat preferably has a coverage of from 0.001 to 4.0 g/m$^2$, more preferably from 0.01 to 2.0 g/m$^2$, and most preferably from 0.1 to 1.0 g/m$^2$.

In a preferred embodiment for the thermosensitive lithographic printing plate of this invention, the thermosensitive layer comprises a polymeric binder, a polymerizable ethylenically unsaturated monomer having at least one terminal ethylenic group, a free-radical initiator, and an infrared absorbing dye. Other additives such as surfactant, dye or pigment, exposure-indicating dye (such as leuco crystal violet, leucomalachite green, azobenzene, 4-phenylazodiphenylamine, and methylene blue dyes), and free-radical stabilizer (such as methoxyhydroquinone) may be added. The monomer-to-polymer weight ratio is preferably at least 1.0, more preferably at least 1.5, and most preferably at least 2.0.

In another preferred embodiment for the thermosensitive lithographic printing plates of this invention, the thermosensitive layer comprises a polymeric binder, a urethane (meth)acrylate monomer having at least 4 (meth)acrylate groups, a free-radical initiator, and an infrared absorbing dye.

In yet another preferred embodiment for the thermosensitive lithographic printing plates of this invention, the thermosensitive layer comprises a polymeric binder having polymer backbone with recurring units having pendant poly(alkylene glycol) side chains, a (meth)acrylate monomer having at least one (meth)acrylate group, a free-radical initiator, and an infrared absorbing dye.

In a preferred embodiment for visible light sensitive lithographic printing plates of this invention, the photosensitive layer comprises a polymeric binder, a polymerizable ethylenically unsaturated monomer having at least one terminal ethylenic group, a free-radical initiator, and a visible sensitizing dye. A hydrogen donor is preferably added to increase the photospeed. Other additives such as surfactant, dye or pigment, exposure-indicating dye, and free-radical stabilizer may be added. The monomer-to-polymer weight ratio is preferably at least 1.0, more preferably at least 1.5, and most preferably at least 2.0.

In a preferred embodiment for violet or ultraviolet light sensitive lithographic printing plates of this invention, the photosensitive layer comprises a polymeric binder, a polymerizable ethylenically unsaturated monomer having at least one terminal ethylenic group, a free-radical initiator, and a violet or ultraviolet sensitizing dye. A hydrogen donor is preferably added to increase the photospeed. Other additives such as surfactant, dye or pigment, exposure-indicating dye, and free-radical stabilizer may be added. The monomer-to-polymer weight ratio is preferably at least 1.0, more preferably at least 1.5, and most preferably at least 2.0.

In another preferred embodiment for the violet or ultraviolet laser sensitive lithographic plates of this invention, the photosensitive layer comprises a polymeric binder, a monomer having at least 3 (meth)acrylate group, a hexaarylbiimidazole or titanocene compound, a dialkylaminobenzophenone compound, and a hydrogen donor. The monomer-to-polymer weight ratio is preferably at least 1.0, more preferably from 1.5 to 6.0, and most preferably from 2.0 to 5.0. A hexaarylbiimidazole compound is preferred among hexaarylbiimidazole and titanocene compounds. A preferred dialkylaminobenzophenone compound is a 4,4'-bis(dialkylamino)benzophenone compound.

In yet another preferred embodiment for the violet or ultraviolet laser sensitive lithographic plates of this invention, the photosensitive layer comprises a polymeric binder, a urethane monomer having at least 4 (meth)acrylate group, a hexaarylbiimidazole or titanocene compound, a dialkylaminobenzophenone compound, and a hydrogen donor. The monomer-to-polymer weight ratio is preferably at least 0.5, more preferably from 1.0 to 6.0, and most preferably from 2.0 to 5.0. A hexaarylbiimidazole compound is preferred among hexaarylbiimidazole and titanocene compounds. A preferred dialkylaminobenzophenone compound is a 4,4'-bis(dialkylamino)benzophenone compound. A non-urethane (meth)acrylate monomer can be added.

In further another preferred embodiment for the violet or ultraviolet laser sensitive lithographic plates of this invention, the photosensitive layer comprises a polymeric binder, a urethane monomer having at least 4 (meth)acrylate group, a non-urethane monomer having at least 4 (meth)acrylate groups, a hexaarylbiimidazole or titanocene compound, a dialkylaminobenzophenone compound, and a hydrogen donor. The weight ratio of the urethane (meth)acrylate monomer to the non-urethane (meth)acrylate monomer is preferably from 0.10 to 10.0, more preferably from 0.20 to 5.0, and most preferably from 0.30 to 3.0. The weight ratio of all the monomers to all the polymeric binders is preferably at least 0.5, more preferably from 1.0 to 6.0, even more preferably from 1.5 to 5.0, and most preferably from 2.0 to 4.0. A hexaarylbiimidazole compound is preferred among hexaarylbiimidazole and titanocene compounds. A preferred dialkylaminobenzophenone compound is a 4,4'-bis(dialkylamino)benzophenone compound.

In yet further another preferred embodiment for the violet or ultraviolet laser sensitive lithographic plates of this invention, the photosensitive layer comprises a polymeric binder having polymer backbone with recurring units having pendant poly(alkylene glycol) side chains, a (meth)acrylate monomer having at least one (meth)acrylate group, a free-radical initiator, and a violet or ultraviolet sensitizing dye. A hydrogen donor is preferably added. Other additives such as surfactant, dye or pigment, exposure-indicating dye, and free-radical stabilizer may be added.

The lithographic plates and photosensitive compositions as described in U.S. Pat. Nos. 6,482,571, 6,576,401, 5,548,222, and 6,541,183, and U.S. patent application Ser. Nos. 10/720,882, 11/075,663, 11/175,518, 11/266,817, 11/336,132, 11/356,911, 11/504,565, and 11/595,468, the entire disclosures of which are hereby incorporated by reference, can be used for the instant invention. The process as described in U.S. patent application Ser. Nos. 11/266,817 and 11/356,911 can be used for the instant invention.

A hydrophilic or oleophilic micro particles may be added into the photosensitive layer to enhance, for example, the developability and non-tackiness of the plate. Suitable micro particles include polymer particles, talc, titanium dioxide, barium sulfate, silicone oxide and aluminum micro particles, with an average particle size of less than 10 microns, preferably less than 5 microns, more preferably less than 2 microns and most preferably less than 1 microns. A suitable particular dispersion is described in U.S. Pat. No. 6,071,675, the entire disclosure of which is hereby incorporated by reference.

The photosensitive layer should exhibit an affinity or aversion substantially opposite to the affinity or aversion of the substrate to at least one printing liquid selected from the group consisting of ink and an adhesive fluid for ink. For example, a wet plate can have a hydrophilic substrate and an oleophilic photosensitive layer, or can have an oleophilic substrate and a hydrophilic photosensitive layer; a waterless plate can have an oleophilic substrate and an oleophobic photosensitive layer, or can have an oleophobic substrate and an oleophilic photosensitive layer. An adhesive fluid for ink is a fluid that repels ink. Fountain solution is the most commonly used adhesive fluid for ink. A wet plate is printed on a wet press equipped with both ink and fountain solution, while a waterless plate is printed on a waterless press equipped with ink.

Infrared lasers useful for the imagewise exposure of the thermosensitive plates of this invention include laser sources emitting in the near infrared region, i.e., emitting in the wavelength range of from 750 to 1200 nm, and preferably from 800 to 1100 nm. Particularly preferred infrared laser sources are laser diodes emitting around 830 nm or a Nd/YAG laser emitting around 1060 nm. The plate is exposed at a laser dosage that is sufficient to cause hardening or solubilization in the exposed areas but not high enough to cause substantial thermal ablation. The exposure dosage is preferably from 1 to 500 $mJ/cm^2$, more preferably from 10 to 300 $mJ/cm^2$, and most preferably from 50 to 200 $mJ/cm^2$, depending on the sensitivity of the thermosensitive layer.

Visible lasers useful for the imagewise exposure of the visible light sensitive plates of this invention include any laser emitting in the wavelength range of from 390 to 600 mm. Examples of suitable visible lasers include frequency-doubled Nd/YAG laser (about 532 nm), argon ion laser (about 488 nm), violet diode laser (about 405 nm), and visible LEDs. Violet laser diode is especially useful because of its small size and relatively lower cost. The exposure dosage is preferably from 0.001 to 2 $mJ/cm^2$ (1 to 2000 $\mu J/cm^2$), more preferably from 0.005 to 0.4 $mJ/cm^2$ (5 to 400 $\mu J/cm^2$), and most preferably from 0.02 to 0.20 $mJ/cm^2$ (20 to 200 $\mu J/cm^2$) depending on the sensitivity of the photosensitive layer.

Ultraviolet lasers useful for the imagewise exposure of the ultraviolet light sensitive plates of this invention include any laser having a wavelength of from 200 to 390 nm. Examples of ultraviolet lasers include ultraviolet diode lasers or LEDs having a wavelength of from 350 to 390 nm. Laser diodes are preferred ultraviolet lasers. The exposure dosage is preferably from 0.001 to 2 $mJ/cm^2$ (1 to 2000 $\mu J/cm^2$), more preferably from 0.005 to 0.4 $mJ/cm^2$ (5 to 400 $\mu J/cm^2$), and most preferably from 0.02 to 0.20 $mJ/cm^2$ (20 to 200 $\mu J/cm^2$), depending on the sensitivity of the photosensitive layer.

Among the visible and ultraviolet lasers, violet or ultraviolet laser (with a wavelength selected from 200 to 430 nm) is particularly useful.

Laser imaging devices are currently widely available commercially. Any device can be used which provides imagewise laser exposure according to digital imaging information. Commonly used imaging devices include flatbed imager, internal drum imager, and external drum imager, all of which can be used for the imagewise laser exposure in this invention.

For on-press developable plate, the plate is preferably exposed on an exposure device, deactivated with a deactivating agent, and then mounted on press to develop with ink and/or fountain solution and then print out regular printed sheets. Preferably, the plate is under a safe light or in substantial darkness during imagewise exposure and deactivation. The ink and/or fountain solution solubilized or dispersed photosensitive layer and/or overcoat can be mixed into the ink and/or the fountain solution on the rollers, and/or can be transferred to the blanket and then the receiving medium (such as paper). The fountain solution roller is engaged (to the plate cylinder as for conventional inking system or to the ink roller as for integrated inking system) for preferably 0 to 100 rotations, more preferably 1 to 50 rotations and most preferably 5 to 20 rotations (of the plate cylinder), and the ink roller is then engaged to the plate cylinder for preferably 0 to 100 rotations, more preferably 1 to 50 rotations and most preferably 5 to 20 rotations before engaging the plate cylinder and feeding the receiving medium. Good quality prints should be obtained preferably under 40 initial impressions, more preferably under 20 impressions, and most preferably under 5 impressions.

For conventional wet press, usually fountain solution is applied (to contact the plate) first, followed by contacting with ink roller. For press with integrated inking/dampening system, the ink and fountain solution are emulsified by various press rollers before being transferred to the plate as emulsion of ink and fountain solution. However, in this invention, the ink and fountain solution may be applied at any combination or sequence, as needed for the plate. There is no particular limitation.

The ink used in this application can be any ink suitable for lithographic printing. Most commonly used lithographic inks include "oil based ink" which crosslinks upon exposure to the oxygen in the air and "rubber based ink" which does not crosslink upon exposure to the air. Specialty inks include, for example, radiation-curable ink and thermally curable ink. An ink is an oleophilic, liquid or viscous material which generally comprises a pigment dispersed in a vehicle, such as vegetable oils, animal oils, mineral oils, and synthetic resins. Various additives, such as plasticizer, surfactant, drier, drying retarder, crosslinker, and solvent may be added to achieve certain desired performance. The compositions of typical lithographic inks are described in "The Manual of Lithography" by Vicary, Charles Scribner's Sons, New York, and Chapter 8 of "The Radiation Curing Science and Technology" by Pappas, Plenum Press, New York, 1992.

The fountain solution used in this application can be any fountain solution used in lithographic printing. Fountain solution is used in the wet lithographic printing press to dampen the hydrophilic areas (non-image areas), repelling ink (which is hydrophobic) from these areas. Fountain solution contains mainly water, generally with addition of certain additives such as gum arabic and surfactant. Small amount of alcohol such as isopropanol can also be added in the fountain solution. Water is the simplest type of fountain solution. Fountain solution is usually neutral to mildly acidic. However, for certain plates, mildly basic fountain solution may be used. The type of fountain solution used depends on the type of the plate substrate as well as the photosensitive layer. Various fountain solution compositions are described in U.S. Pat. Nos. 4,030,417 and 4,764,213.

This invention is further illustrated by the following non-limiting examples of its practice.

EXAMPLES 1-3

An electrochemically grained, anodized, and polyvinylphosphonic acid treated aluminum sheet was first coated with a 0.1% aqueous solution of polyvinyl alcohol (Airvol 540, from Air Products) with a #6 Meyer rod, followed by drying in an oven at 100° C. for 2 min. The polyvinyl alcohol coated substrate was further coated with the photosensitive layer formulation PS-1 with a #8 Meyer rod, followed by drying in an oven at 90° C. for 2 min.

| PS-1 | |
| --- | --- |
| Component | Weight ratios |
| Neocryl B-728 (Polymer from Zeneca) | 2.75 |
| DPHA (Acrylic monomer from UCB Chemicals) | 6.56 |
| Pluronic L43 (Nonionic surfactant from BASF) | 0.56 |
| 2,2-Bis(2-chlorophenyl)-4,4',5,5'-tetraphenyl-1,1'-biimidazole | 1.21 |
| 4,4'-Bis(diethylamino)benzophenone | 0.77 |
| 2-Mercaptobenzoxazole | 0.15 |
| 2-Butanone | 88.00 |

The photosensitive layer coated plate was further coated with a water-soluble overcoat OC-1 using a #6 Meyer rod, followed by drying in an oven at 100° C. for 2 min. All the coatings were performed under a red light and the plate was then stored in a light-tight box.

| OC-1 | |
| --- | --- |
| Component | Weight (g) |
| Airvol 203 (polyvinyl alcohol from Air Products) | 4.84 |
| Silwet 7604 (Surfactant from Union Carbide) | 0.02 |
| Triton X-100 (Surfactant from www.chemistrystore.com) | 0.14 |
| Water | 95.00 |

The plate was exposed with a violet plate imager equipped with a 60 mw violet laser diode emitting at about 405 nm (MAKO-8 from ECRM) for a dosage of about 90 μJ/cm$^2$. The plate was imaged in an orange light room (with Fuji Yellow FV30 lights from Encapsulite), and was kept in a light-tight box before and after imaging.

The laser exposed plate was cut into 3 pieces under red light. The first piece was treated with a 5% citric acid aqueous solution by dipping in the solution for 10 seconds. The second piece was rinsed with water by dipping in water for 5 seconds to remove the overcoat. The third piece was not treated. The treatments were performed under red light.

Each of the treated plates was tested on a wet lithographic press (AB Dick 360) under office white fluorescence light. The plate was directly mounted on the plate cylinder of the press. After starting the press, the fountain roller was engaged for 20 rotations, the ink roller (carrying emulsion of ink and fountain solution) was applied to the plate cylinder for 20 rotations, and the plate cylinder was then engaged with the blanket cylinder and printed with paper for 200 impressions. The printed sheets were evaluated for on-press developability of the plate, with the results summarized in Table 1.

TABLE 1

| Treatment of the plate | Background at 20 impressions | Background at 200 impressions | Inking in imaging areas |
| --- | --- | --- | --- |
| Dip in a 5% citric acid aqueous solution | Clean | Clean | Good |
| Rinse with water | Toning | Toning | Good |
| No treatment | Inked | Inked | Good |

I claim:

1. A lithographic printing plate imaging and deactivation assembly comprising:
   (a) an imager capable of imagewise exposing a lithographic plate with a laser having a wavelength selected from 200 to 1200 nm;
   (b) a lithographic printing plate having on a substrate a photosensitive layer capable of hardening upon exposure to said laser as well as under white room light;
   (c) a deactivating solution and a structure for providing said deactivating solution to deactivate without developing said plate; wherein said deactivating solution is an acidic aqueous solution with a pH of less than 4.0, and the non-hardened areas of said photosensitive layer are capable of hardening under white light before contacting with said solution and becoming incapable of hardening under white light after contacting with said solution; and
   (d) a means for transporting said plate to said imager for imagewise exposure, then to said structure for deactivation, and further to the exit of said assembly as an exposed plate which is deactivated without development.

2. The assembly of claim 1 being shielded with non-transparent or yellow or red light-passing-only covers so that no or substantially no room light or the unsafe portion of the room light reaches the plate when being handled and exposed on said imager, when transporting from said imager to said deactivating device, and/or when passing through the deactivating device before being deactivated.

3. The assembly of claim 1 being shielded with yellow or red light-passing-only covers so that no or substantially no unsafe portion of the room light reaches the plate when being handled and exposed on said imager, when transporting from said imager to said deactivating device, and/or when passing through the deactivating device before being deactivated.

4. The assembly of claim 1 being shielded with covers so that no or substantially no room light reaches said plate on said assembly before being deactivated.

5. The assembly of claim 1 wherein said imager is connected to a cassette containing at least one plate and capable of automatically feeding said plate from said cassette to said imager for imagewise exposure.

6. The assembly of claim 1 wherein said imager is connected to a cassette containing at least one plate and capable of automatically feeding said plate from said cassette to said imager for imagewise exposure; and said assembly and cassette are shielded with covers so that no or substantially no room light reaches the plate when said plate is in said cassette and is handled, exposed, and deactivated on said assembly before being deactivated.

7. The assembly of claim 1 wherein said laser is a violet or ultraviolet laser having a wavelength selected from 300 to 430 nm.

8. The assembly of claim 1 wherein said laser is an infrared laser having a wavelength selected from 750 to 1200 nm.

9. The assembly of claim 1 wherein said photosensitive layer in the non-hardened areas is developable with ink and/or fountain solution.

10. The assembly of claim 1 wherein said structure contains one or more rollers for applying said deactivating solution to said plate when said plate passes through said structure.

11. The assembly of claim 1 wherein said device further comprises a heating unit for heating said plate before passing said plate through said structure.

12. The assembly of claim 1 wherein said device further comprises a pair of squeegee rollers for removing any overflowing deactivating solution from the deactivated plate after passing said plate through said structure.

13. The assembly of claim 1 wherein said device further comprises a drying unit for blowing hot or ambient air to the deactivated plate after passing said plate through said structure.

14. The assembly of claim 1 wherein said imager is an external drum imager.

15. The assembly of claim 1 wherein said imager is an internal drum imager.

16. The assembly of claim 1 wherein said imager is a flatbed imager.

* * * * *